United States Patent [19]

Ono et al.

[11] 4,028,105
[45] June 7, 1977

[54] COLOR CORRECTION PROCESS FOR COLOR PRINTING USING ELECTROLUMINSCENT ELEMENT

[76] Inventors: Yoshio Ono, No. 25-2, Nishirendaino-cho, Murasakino, Kita, Takashi Sakamoto, No. 16, Sagasono-cho, Narutaki, Ukyo, both of Kyoto, Japan

[22] Filed: Apr. 16, 1975

[21] Appl. No.: 568,711

[30] Foreign Application Priority Data

Apr. 17, 1974  Japan .............................. 49-42292

[52] U.S. Cl. ...................................... 96/3 D; 96/5; 96/14; 96/24; 96/45.1
[51] Int. Cl.² ...................... G03C 7/04; G03F 1/00; G03C 1/92; G03C 7/00
[58] Field of Search ................ 96/30, 31, 32, 45.1, 96/24, 5, 14

[56] References Cited

UNITED STATES PATENTS

| | | | |
|---|---|---|---|
| 2,883,556 | 4/1959 | Jenny et al. | 96/45.1 |
| 2,971,841 | 2/1961 | Moore | 96/30 |
| 3,591,283 | 7/1971 | Peisach | 96/45.1 |
| 3,600,172 | 8/1971 | Land | 96/45.1 |
| 3,615,441 | 10/1971 | Deneau | 96/30 |

*Primary Examiner*—David Klein
*Assistant Examiner*—Richard L. Schilling
*Attorney, Agent, or Firm*—Zarley, McKee, Thomte & Voorhees

[57] ABSTRACT

A photosensitive material for making a color separation record is imaged through a color separation filter. An electroluminescent panel having an image reversal property is then placed on the material. The panel is imaged through a color correction filter and radiates a negative color removal image onto the material.

4 Claims, 11 Drawing Figures

COLOR CORRECTION PROCESS FOR COLOR PRINTING USING ELECTROLUMINSCENT ELEMENT

The present invention generally relates to a color printing process utilizing an image reversing device of a flat panel type and, more particularly, to a masking process for removal of under colors in the color printing process.

In a prior art multi-color printing process, color images are produced by using printing inks of three primary colors such as cyan, magenta and yellow in addition to black. In a high-speed wet type printing process, printing inks are printed over initially printed inks before the latter dry. The amount of ink to be used is limited in actual practice and, therefore, it has heretofore been proposed to reduce the amount of printing ink.

It is well known in the art that the amount of printing ink can be reduced by a masking process for removing under-colors for thereby faithfully reproducing color images. The removal of the under-colors can be achieved by reducing the amounts of printing inks such as cyan, magenta and yellow at portions where these inks are printed one upon another by an amount equal to each of the equivalent neutral densities of the various printing inks corresponding to gray, and the removed amount of each printing ink is compensated by black ink.

It is an object of the present invention to provide an improved masking process for removing colors in a color printing process.

It is another object of the present invention to provide a process for masking a color separation record including color removal imaging utilizing an electroluminescent panel which radiates an image which is the negative of an image incident thereon.

These and other objects, features and advantages of the present invention will become more apparent from the following description when taken with the accompanying drawings, in which:

FIG. 5 is a fragmentary section illustrating a preferred example of an image reversing device used in the process of the present invention;

Figure 1:
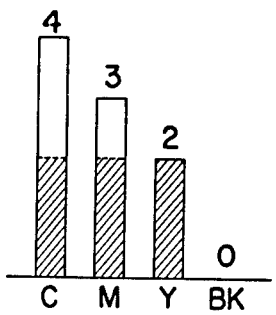
FIGS. 1 through 3 are views showing effects obtainable with under color removal.
Figures 8A, 8B:
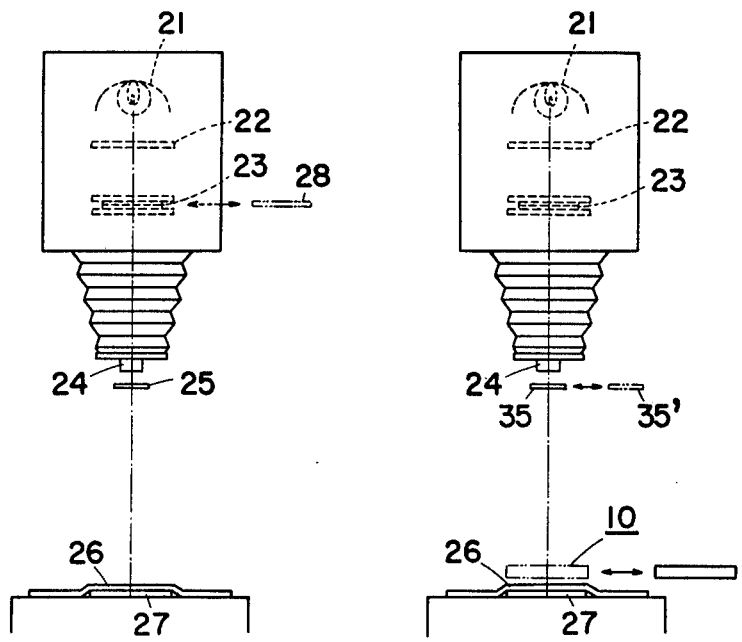
Figure 9:
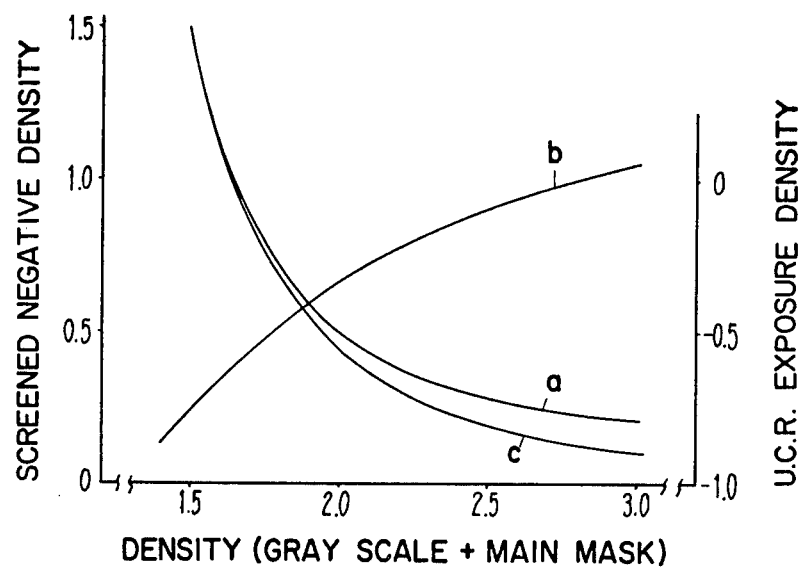
Figure 10:
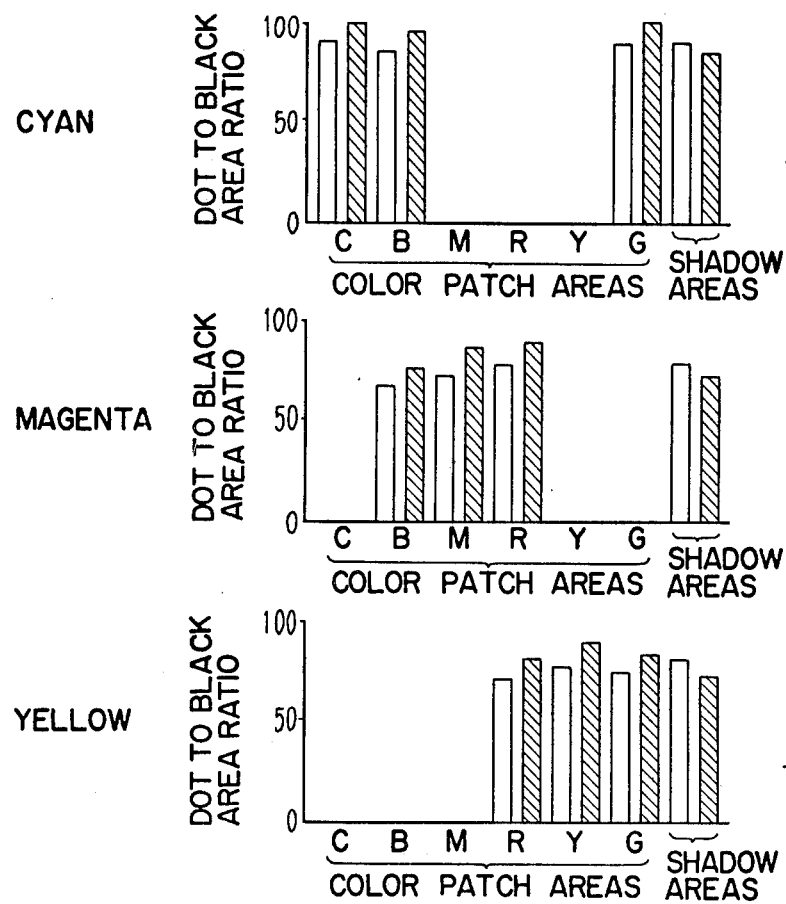

FIG. 8A schematically illustrates an enlarger-type color image projector to carry out a prior art printing process;

FIG. 8B illustrates a similar projector but which is applicable to practice the process according to the present invention;

FIG. 9 shows curves representing characteristics of a screened negative which has been subjected to under color removal according to the process of the present invention; and FIG. 10 graphically shows area ratios of screened positives with and without additional exposure according to the process of the present invention.

Where reproduction of a color of an image requires inks of cyan, magenta and yellow in amounts of 4, 3 and 2, respectively, in terms of equivalent neutral density as shown in FIG. 1, th smallest value of the amounts of the three color inks, or an amount corresponding to the amount 2 of the yellow ink is considered necessary for the reproduction of a gray.

This indicates that the color obtained with the proportions shown in FIG. 1 can be produced if the cyan, magenta and yellow inks are reduced by amounts respectively corresponding to 2 in terms of equivalent neutral density while the black ink has its amount increased corresponding to 2. In this instance, the additional amount of black ink corresponding to 2 compensates for the total amount of 6 of cyan, magenta and yellow inks so that the total amount of color inks is reduced to ⅓ in portions corresponding to gray.

Figure 2:
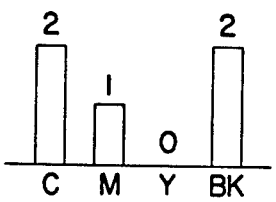
Figure 3:
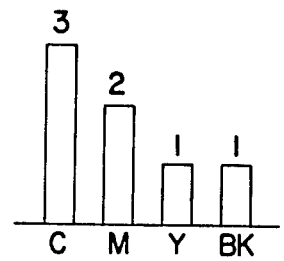

While the exemplary proportions shown in FIG. 2 represent a case of complete under color removal, in practice partial color removal as indicated in FIG. 3 is carried out such that cyan, magenta and yellow color inks are reduced by amounts corresponding to 1, for instance, and the black ink is increased by an amount 1. The partial under color removal may comprise a variety of proportions in the amounts of the inks other than that exemplified in FIG. 3. It will be readily understood that the color reproduced by the partial under color removal of FIG. 3 is exactly the same as that obtainable with the proportions of FIG. 1 or 2.

It will be apparent from the above description that the under color removal is adapted not to reduce the amounts of printing inks evenly throughout the image surface but to reduce the color inks by preselected amounts with priority given to relatively dark portions (heeinafter referred to as "shadow portions"). Necessary amounts of the inks should not be reduced in bright color portions (hereinafter referred to as "color portions").

This on the other hand suggests a possibility of increasing the amount of inks necessary for color portions without varying that of gray portions.

If color inks in general use are printed one upon another with a common density in an attempt to reproduce black, the result is often reddish black. With this in view, it is generally practiced to appreciably reduce the amounts of magenta and yellow inks relative to that of cyan ink, e.g., the proportion is 80% at maximum of the cyan ink. The 80% or so of the amounts of magenta ink is not enough, however, in dark color portions. Dark red is unobtainable unless the magenta ink is printed substantially with the same density as the others.

The use of the under color removal process eliminates this drawback and serves to provide excellent reproduction of black portions as well as dark color portions. In the production of a color separation record, a color separation record film is first subjected to usual exposure with or without auxiliary exposure such that the color inks in the shadow and dark-color portions are provided with a common density. The film is then subjected to additional or under color-removing exposure so as to have the common ink density preserved in the light color portions while having the color ink amounts reduced in the shadow portions alone down to 80% for example of the common density.

The under color removal is thus bifunctional; reducing the amount of inks printed one upon another, and increasing the amount of inks in light color portions.

Another advantage derived from such under color removal is economic. The removed proportions of the color inks which are generally costly can be replaced with a black ink alone, which affords a cutdown in cost.

The color printing process is available in two different forms: one consisting of a step for separating colors of an original image and a step for screening the resultant color separation record, and the other consisting of the color separation and screening carried out simultaneously (generally referred to as "direct screening"). The following description will be made in conjunction with direct screening by way of example.

To achieve under color removal through photographic means in direct screening, there should conventionally be prepared a negative whose shadow portions are of a low density and whose color and highlight portions are of a high density (a negative obtained by exposure through a black record separating filter or a filter of the same color as that of a record for which the under color is to be removed). A negative of the kind described above is usually referred to as an under "color removing mask".

Figure 4:
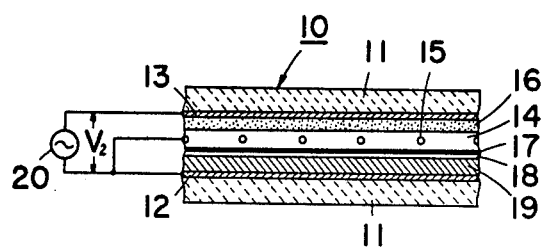
FIG. 4 shows in an enlarged scale size variations of dots caused by additional exposure for under color removal.

An original having an image and a main mask (for color and contrast correction) overlayed one upon the other is replaced after a normal main exposure with the above-mentioned under color removing mask for an additional exposure every time a screened record of cyan, magenta or yellow is produced. When a normal screened negative is produced for a color separation screened record, each dot in the dot pattern constituting a shadow portion has a size substantially equal to that of the dots in the bright color portions (FIG. 4A). After the additional exposure using a under color removing mask whose shadow portions are of a low density and whose color portions are of a high density (FIG. 4B), a dot pattern having a relatively large dot size is formed in the shadow portions of the color separation record whereas the dot size remains unchanged in the color portions (FIG. 4C).

When each of the negative separation records is reversed into a screened positive, the dot size in the shadow portions is markedly smaller than in the case of common-density printing, e.g., approximately 80%, while that in the color portions is equal to or substantially equal to the dot size in the case of common-density printing, e.g., 95 to 100 %. Thus, the under color removal is satisfactorily achieved.

With the prior art process described above, however, the under color removal cannot be attained without provision of one to three negatives in advance which serve as under color removing masks. Moreover, an original consisting of a mutually overlayed image and main mask must be exchanged with the negatives for masking with the most precise alignment. For this exact alignment in the replacement of the original with the masking negative and vice versa, there has been employed alignment means which is generally called the "pin-and-punch system". Even this particular system cannot provide a satisfactory counter-measure against misalignment unless the original and the masks replaceable therewith are constructed rigidly and handled with due exactness.

When the color image projector used for the printing process is particularly of an enlarger type, the possibility of such misalignment is more pronounced because the replacements are carried out in an entirely dark room.

Despite the widely admitted significant advantages, under color removing masking is in many cases not employed on account of the large number of process steps, prolonged period of time and increased amount of materials required.

The masking process according to the present invention is practiced using a flat panel type image reversing device, an example of which is illustrated in FIG. 5 in the form of an electroluminescent plate or panel 10. The plate 10 comprises a pair of transparent glass plates 11, first and second transparent electrodes 12 and 13, respectively, commonly formed of tin oxide ($SnO_2$) for example, a layer 14 of photoconductive material such as cadmium sulfide (CdS), a plurality of electrodes 15 disposed parallel to one another with their ends connected commonly to a variable D.C. power source 20, a transparent dielectric layer 16, an opaque layer 17, a reflecting layer 18, and a layer 19 of electroluminescent material.

In areas where no light is incident on the surface of the second transparent electrode 13, the photoconductive layer 14 acts as an insulator and the voltage of the source 20 is applied across the layer 19. The layer 19 consequently luminesces to its maximum intensity, and the brightest possible light is radiated from the side of the first electrode 12.

Figure 6:
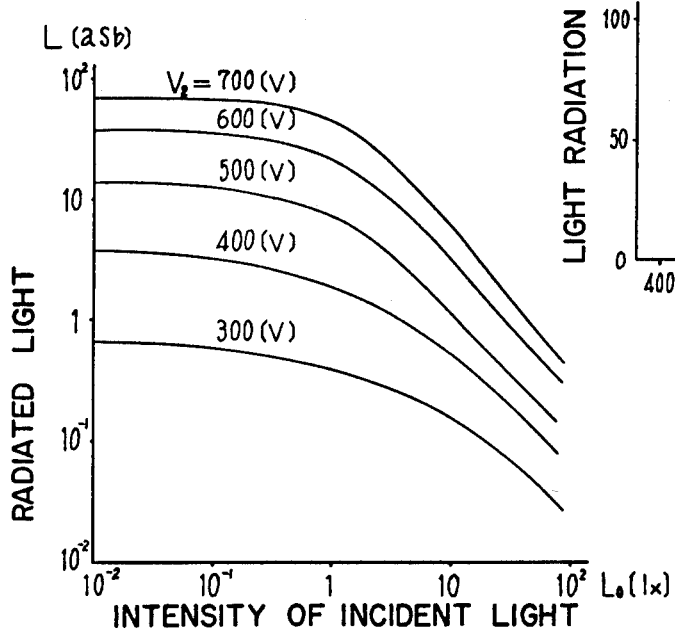
FIG. 6 shows curves representing intensity characteristics of input and output images for the device shown in FIG. 5.

On the other hand, in areas where the incident light on the second electrode 13 has a high intensity, the photoconductive layer 14 becomes electrically conductive with the result that the layer 14 is grounded through the parallel electrodes 15 so that no voltage is applied across the layer 19. The layer 19 therefore does not luminesce. Such a plate 10 has image reversing and amplifying characteristics shown by curves in FIG. 6 wherein the abscissa and ordinate represent the intensity of incident light Lo [lx] and radiated light L [asb], respectively. Designated as $V_2$ in FIG. 6 are various voltages produced by the power source 20 shown in FIG. 5.

Where the electroluminescent plate 10 featuring the characteristics described above is employed to achieve the purpose of the invention, it should preferably satisfy the following requirements in addition to having a negative luminous property. It should produce relatively uniform light output in shadow areas which drops off rather sharply in the color areas. These requirements will be met if the "shoulder" sections of the characteristic curves shown in FIG. 6 are utilized.

Figure 7:
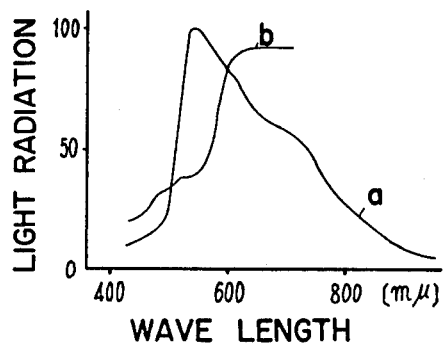
FIG. 7 shows an exemplary spectral sensitivity characteristic of a photoconductive layer included in the device illustrated in FIG. 5 and a preferable characteristic of the same required for the additional exposure.

When formed of cadmium sulfide, the photoconductive layer 14 shows a spectral sensitivity characteristic as represented by a curve $a$ in FIG. 7. The other spectral sensitivity curve $b$ of FIG. 7 is more preferable, however, in order to provide the layer 14 with a spectral sensitivity suited for magenta and yellow records, which particularly require the removal of under colors. In the actual use of the plate 10, therefore, a suitable color compensating filter may be placed in front thereof so as to shift the spectral sensitivity from that corresponding to the curve $a$ to that corresponding to the curve $b$, controlling the effect of under color removal. The use of a common color compensating filter for two or three color separation records for converting spectral sensitivities is permitted in so far as the additional exposure is carried out with a spectral sensitivity common to the respective records. In case where the operation is intended with different spectral sensitivities for the records, there should only be prepared color compensating filters having spectral sensitivities which conform to the respective records (including that of the photoconductive layer).

FIG. 8A shows a prior art projector (no numeral) for producing a color separation record with color removal. A light source 21 radiates light through a diffusing plate 22 for uniforming the brightness and a transparent original image document 23. A main mask (not shown) may be placed in contact with the document 23. A lens 24 focuses the image onto a photoconductive film 27 through a color separating filter 25. After the main exposure, the document 23 is placed with a negative under color removal mask 28 which must occupy the same exact position as the document 23. An additional under color removal exposure is provided through the mask 28. A half-tone or resolving screen 26 may be placed on the film 27.

The same projector shown in FIG. 8A may be used in the process of the present invention. The film 27 is first imaged through a color separation filter 35. After this main exposure, the document 23 is not replaced with the mask 28 but is left untouched in the projector. The filter 35 is replaced by a color compensation filter 35' to correct the spectral sensitivity of the plate 10 as described above. The plate 10 is placed on the screen 26 and film 27 and the image of the document 23 projected onto the film 27 through the filter 35'.

Upon additional exposure the shadow portions of the document are reversed so that the shadow portions of the screened record formed on the film are subjected to additional exposure. The plate 10 radiates an image which is a negative of the incident image onto the film 23. This increases the dot size in the dot pattern of each shadow portion. The images of the color portions of the document 23 are reversed by the plate 10 such that the light from the plate 10 in those portions has a low luminous intensity. Consequently, color portions on the film 27 receive practically no additional exposure and the dot size is unchanged.

It will be apparent that in this way the present process provides the same excellent results through a simplified operation as those obtainable with conventional use of an under color removing mask. It should be noted that the additional exposure for under color removal provides substantially the same effects when conducted before or after the main or first exposure.

It has already been discussed that the shoulder sections of the characteristic curves shown in FIG. 6 may preferably be employed in using the plate 10 for the present masking method. To this end, it is necessary to constantly maintain a given average intensity of light incident on the plate 10 and to hold the shoulder sections constant.

In enlarger-type projectors illustrated as being available for practicing the present process, there has been made extensive use of a system wherein through measurement of luminous intensity at the focusing surface, the iris and the like (not shown) are adjusted even if the magnifying powers and the density conditions of original documents are different to facilitate constant brightness, constant exposure-time imaging.

It follows that the light incident upon the light incident upon the plate 10 can readily be provided with a constant average intensity.

A difficulty may be experienced in applying the above-mentioned luminous intensity measurement to color image projectors of floor type, suspension type and other transverse types due to their inherent constructions. However, the present invention is also applicable to these transverse-type projectors if an automatic iris arrangement is equipped to maintain the luminous intensity on the focusing surface constant.

The process illustrated in FIG. 8B will now be described with more specific data.

Projector: Enlarger-type color image projector DSC-635-E manufactured by Dainihon Screen Manufacturing Co., Ltd.
Light source: 8KW pulsed xenon lamp
Main mask: Kodak Trimask
Screen: Chain-Dot Contact Screen ($150^L$) for negatives manufactured by Dainihon Screen Manufacturing Co., Ltd.
Film: Kodak Pan
Color separating filters: Kodak Nos. 25, 58, 47B, 85B
Image reversing plate: Flat panel type (10× 12 cm) manufactured by Matsushita Electric Co., Ltd.
Filter for compensating spectral sensitivity of the Image reversing plate: Kodak CC-30M These were used for direct screening with magnification = 14/1, F/11 (main and highlighting exposures) and F/5.6 (U.C.R. exposure) for the following respective exposure times.

1. With color removal:
Exposure times

Cyan Record

Highlighting exposure — 12.5% of main exposure
Main exposure — 8 sec.
Flashing exposure — 3 sec.
Additional exposure — 2 min.

Magenta Record

Main exposure — 19 sec.
Flashing exposure — 3 sec.
Additional exposure — 4 sec.

Yellow Record

Highlighting exposure — 2.5% of main exposure
Main exposure — 47 sec.
Flashing exposure — 3 sec.
Additional exposure — 4 sec.

Black Record

Main exposure — 38 sec.

2. Without color removal:
Exposure times

Cyan Record

Highlighting exposure — 16% of main exposure
Main exposure — 7 sec.
Flashing exposure — 7 sec.

Magenta Record

Highlighting exposure — 2.5% of main exposure
Main exposure — 17 sec.
Flashing exposure — 10 sec.

Yellow Record

Highlighting exposure — 6% of main exposure
Main exposure — 31 sec.
Flashing exposure — 10 sec.

Black Record

Main exposure — 35 sec.
Flashing exposure — 3 sec.

Screened negatives subjected to the under color removal process showed characteristics exemplified by curves illustrated in FIG. 9, in which the axis of the abscissa indicates the density of gray scale plus main mask and the axes of the ordinate the density of the screened negative and the U.C.R. exposure intensity. A curve $a$ shows the reproduction characteristic only with the main exposure. When the main exposure is followed by the additional exposure designated by a curve $b$, the reproduction characteristic designated by a curve $c'$ is obtained. While in the shadow portions sufficient additional exposure is obtained to change the screened negative density to a marked extent, in the color highlights the additional exposure is close to zero so that the negative density substantially remains unchanged.

FIG. 10 is a comparative illustration of the amounts of inks in color-patch and shadow areas for each screened positive which has been produced by reversing the negatives.

To compare the dot to black area ratios of a screened positive obtained with and without color removal taking the magenta record as on example (hatched bars corresponding to the case with under color removal), the shadow portion ratio is 80% with only the usual exposure but reduced to 73% with the additional exposure. In the color-patch areas, on the other hand, in the red area (R) the ratio is markedly increased from 79 to 91% when subjected to the additional exposure.

The amounts of the printing inks are also increased in other color-patch areas, which is indicative of an improvement in the chroma of the under color areas. Similar effects are produced by the under color removal in the cyan and yellow record.

While the description heretofore has concentrated on the application of the present process to direct screening, it should be noted that satisfactory under color removal is attainable by applying the present method to the two-step process.

Since in direct screening an original document having an image and a main mask overlayed on each other is used and a color separation screened record is immediately produced through the main exposure, the additional exposure for under color removal is applied directly onto the screened record. In contrast, in the two-step process, color separation is performed to produce a continuous-tone color separation record which is then screened to provide a screened record.

As compared with the prior art process wherein under color removal is effected in the screening step, it is effected in the color separating step according to the present method. Thus, the present method provides under color removal principally in the same manner as in the case of direct screening and therefore is readily applicable to such a two-step process.

It should be noted that the present method is applicable not only to the case where the original is a transparency but to the case where a color reflective original is employed. To separate colors of a reflective color original general use is made of a so-called "camera-back masking method" in which a color separating exposure is performed with the main mask located closer to the focusing surface and just in front of the color separation film. The method according to the present invention is combined with camera-back masking method such that, during the additional exposure, the main mask is replaced by an image reversing device whereupon the device is caused to reversedly luminesce in response to light emitted directly from the original color document (through an aforementioned suitable color correction filter) without using the main mask, thus effecting additional exposure for the removal of under color. The same holds similarly in continuous-tone color separation and in direct screening.

It should be noted that the additional exposure without using the main mask is also applicable to a transparent color original.

When the image reversing device receives the image with the main mask removed, the image has its contrast range increased to such an extent that the contrast characteristic of the radiated light effecting the additional exposure is improved. Should, however, the additional exposure without using the main mask be done with a transparent color original, additional manual work is necessitated to place the image and the mask one upon the other by adjusting the alignment and to separate them from each other every time each record is exposed.

It should further be noted that the present method is also applicable to a contact-type color separation process (including continuous-tone separation and direct screening separation).

In this type of color separation process an original having an image and a main mask placed one upon the other is placed in close contact with a color separation film (with or without provision of a contact screen) and the film is subjected to the usual main exposure (main light source in combination with flashing and highlighting sources if necessary), the additional exposure according to the invention being applied before or after the first exposure.

For this purpose, an image reversing device is placed on a color separation film whereupon an original image document or an original comprising an image document overlayed on a main mask is layed on the image reversing device such that its alignment conforms to that for the main exposure. The image reversing device is then irradiated through a suitable color compensating filter with light transmitted through the image or the original. The alignment of the original may be obtained with a pin-and-punch system utilizing positioning pins having a length which is greater than the thickness of the image reversing device.

It should be born in mind that the construction of an image reversing device is not limited to that illustrated in FIG. 5, but may have any desired configuration in so far as it is of a flat panel type which has a negative-positive reversing characteristic and meets various conditions of sensitivity, output light intensity, input and output characteristics and the like.

It will now be appreciated from the foregoing that color removal masking effected according to the present process eliminates the need of a mask which must otherwise be produced for every original image. It will also be appreciated that, in the additional exposure for under color removal, the original need not be replaced with an under color removing mask for each color separation record, obviating failures in alignment.

It will further be appreciated that the color correction filter and the image reversing device can be more readily set in predetermined positions by, for example, arranging color separating and color correction filters in a turret-like manner so that the image reversing device may be set only when the color correction filter has been set to a predetermined position. Another outstanding advantage featured by the present invention is the cut-down in printing costs.

What is claimed is:

1. In a process for making a color separation record for color printing including the steps of:
   a. applying a light image onto the surface of a photosensitive material with a color filter for color separation;
   b. placing an electroluminescent member in close proximity to the upper surface of the photosensitive material; the member having the property of the lower surface thereof emitting light in response to the amount of light impinged on the upper surface thereof; the member also having the property of radiating onto the surface of the photosensitive material a light image which is the negative of the light image applied onto the upper surface of the member; and exposing the said electroluminescent member to the said light image through a color correction filter, and then
   c. exposing the said photosensitive material to a reversal of the said light image radiated from the electroluminescent member when said member is in registration with the photosensitive material.

2. The process according to claim 1, in which step b is performed before step a.

3. The process according to claim 1, in which step b is performed after step a.

4. The process according to claim 1, in which the light image is applied onto the surface of the photosensitive material through a screen in step a and the light image from the member is applied onto the surface of the photosensitive material through the screen in step c.

* * * * *